US005879531A

United States Patent [19]

Schmedding et al.

[11] Patent Number: 5,879,531
[45] Date of Patent: Mar. 9, 1999

[54] METHOD OF MANUFACTURING AN ARRAY OF ELECTRICAL CONDUCTORS

[75] Inventors: George Robert Schmedding, Hummelstown; Basil Daniel Washo, Harrisburg, both of Pa.

[73] Assignee: The Whitaker Corporation, Wilmington, Del.

[21] Appl. No.: 723,231

[22] Filed: Sep. 27, 1996

Related U.S. Application Data

[63] Continuation-in-part of Ser. No. 611,733, Mar. 6, 1996, abandoned.

[51] Int. Cl.[6] .............................. C25D 5/02; H05K 3/10
[52] U.S. Cl. ........................... 205/125; 205/78; 205/129; 205/136; 205/160; 205/183
[58] Field of Search .............................. 205/78, 125, 129, 205/136, 160, 161, 183

[56] References Cited

U.S. PATENT DOCUMENTS

| | | | |
|---|---|---|---|
| 2,474,502 | 6/1949 | Suchy | 205/160 |
| 2,874,085 | 2/1959 | Brietzke | 156/150 |
| 2,884,571 | 4/1959 | Hannahs | 205/78 X |
| 3,167,490 | 1/1965 | Friedman | 205/125 |
| 3,385,773 | 5/1968 | Frantzen | 205/125 |
| 3,407,125 | 10/1968 | Fehlner | 205/103 |
| 4,847,139 | 7/1989 | Wolf et al. | 428/209 |
| 4,883,708 | 11/1989 | Kariya et al. | 442/198 |
| 5,121,297 | 6/1992 | Haas | 361/751 |
| 5,616,230 | 4/1997 | Otsuka et al. | 205/125 |

*Primary Examiner*—Kathryn Gorgos
*Assistant Examiner*—William T. Leader
*Attorney, Agent, or Firm*—Gerald K. Kita

[57] ABSTRACT

Electrical conductors (2) embedding filaments (4) of a fabric (3), and substantially filling interstices (5) that coextend with the imbedded filaments (4), are fabricated by plating conductive material onto a surface (14) of a passivated cathode against which the fabric (3) is held. Resist material (19) conforms the conductive material to form an array of electrical conductors (2).

1 Claim, 3 Drawing Sheets

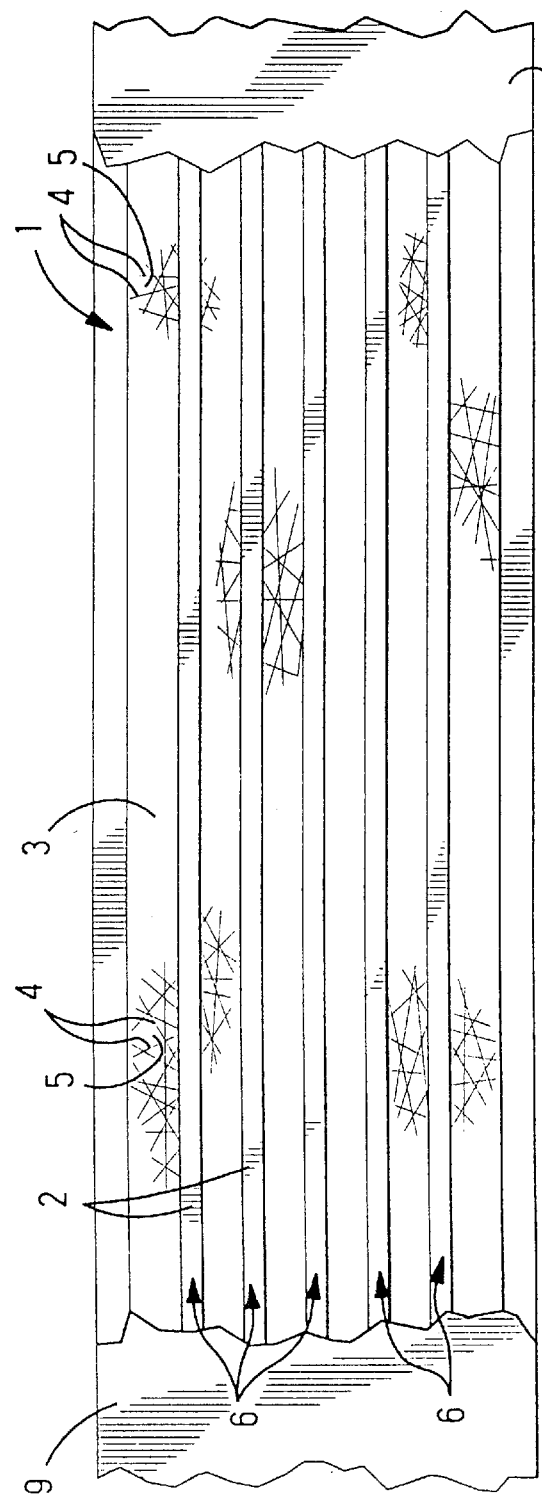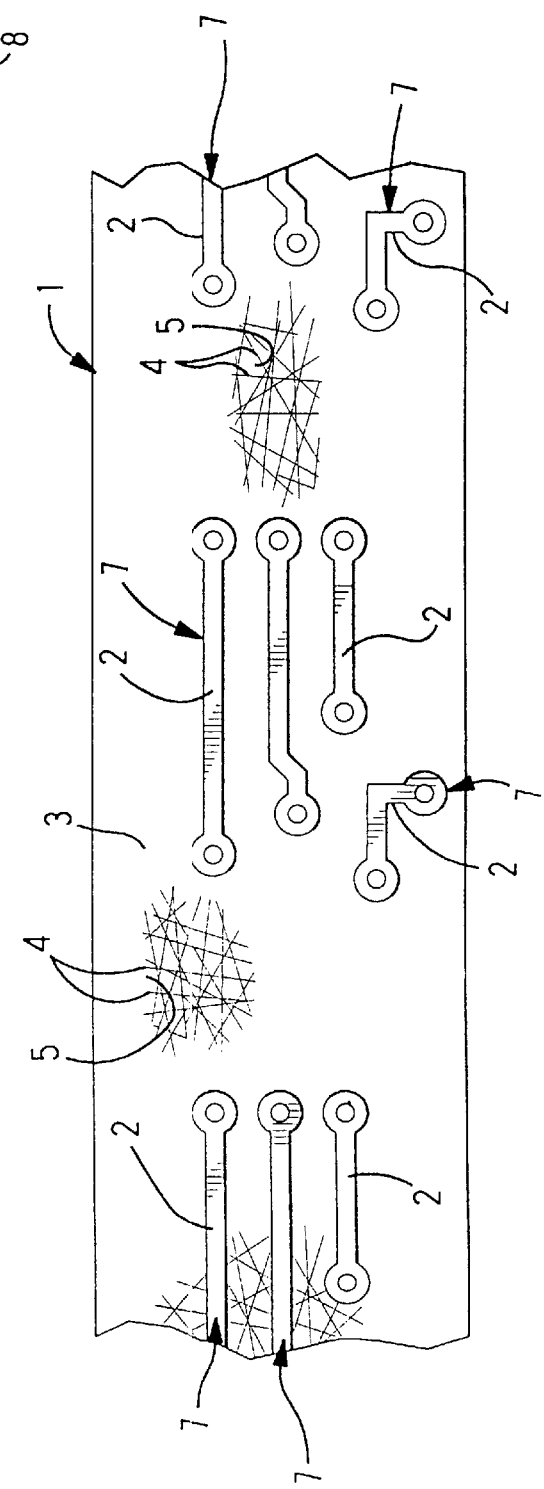
Fig. 1
Fig. 2

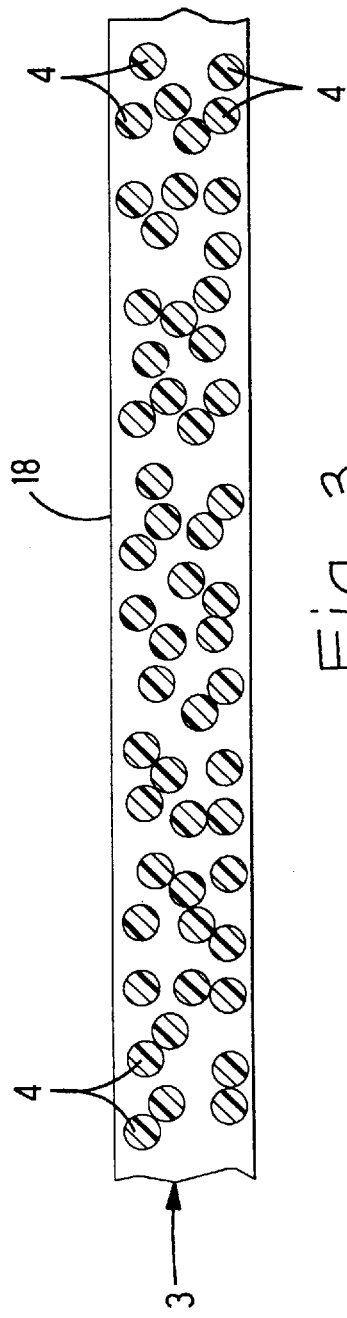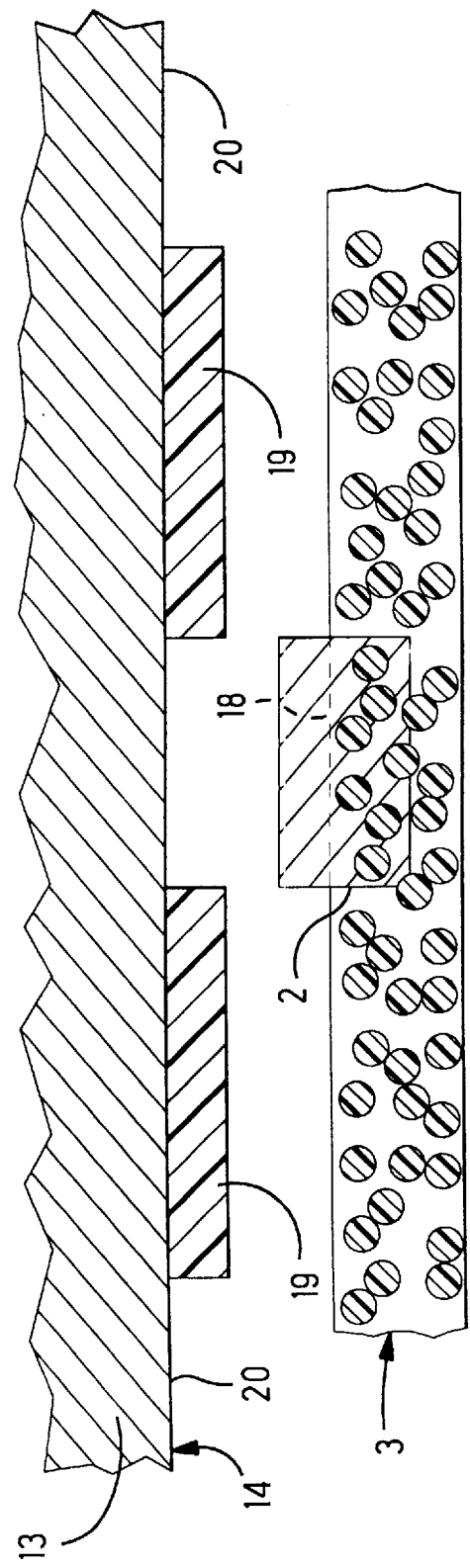

METHOD OF MANUFACTURING AN ARRAY OF ELECTRICAL CONDUCTORS

This application is a continuation-in-part of application Ser. No. 08/611,733; filed on Mar. 6, 1996, now abandoned.

FIELD OF THE INVENTION

The present invention relates to an array of electrical conductors and a method of manufacturing an array of electrical conductors.

BACKGROUND OF THE INVENTION

U.S. Pat. No. 3,167,490 describes a known array of electrical conductors comprising, conducting material deposited on individual filaments of a fabric, the conducting material encompassing the filaments to the extent that the filaments are first rendered conductive by a preliminary deposit of a conducting material on the filaments. Contact with a cathode in the form of a mesh or perforated sheet allows deposits of the conducting material onto the conducting filaments in a nonuniform manner. The conducting material is concentric with the conducting filaments and preserves interstices that coextend in the fabric with the filaments, such that the interstices are present throughout the conductors to provide a mesh that is permeable, meaning porous. The permeable conductors are subject to trapping contaminants in the interstices, and carry relatively low electrical current.

A further disadvantage of the known array of conductors resides in a requirement to render the fabric conductive prior to depositing conducting material onto the fabric.

SUMMARY OF THE INVENTION

According to the invention, impermeable conductors on a fabric are capable of higher current carrying capacity than the known permeable conductors.

According to an embodiment, conductors are secured mechanically to a fabric by embedding portions of the fabric in the conductors, and by the conductors substantially filling interstices that coextend in the fabric with the embedded portions of the filaments. An advantage resides in the conductors being secured to the fabric without a need for rendering the filaments conductive.

According to a further feature of the invention, the conductors are shaped into an array of conductors by a pattern of a resist material on the fabric, or by plating metal selectively in a pattern of electrical conductors onto a surface of a cathode against which the fabric is held.

According to another feature of the invention, the conductors bond to the embedded portions of the fabric that have been coated with a silane material that enhances chemical bonding of the conductors to the fabric.

According to another feature of the invention, the conductors that adhere to embedded portions of the fabric are rendered more ductile and more limber by the application of a polymer coating comprising an amine or carboxylic acid, molecular structure that enhances nonbrittle, ductile, chemical bonding of the conductors to the fabric.

According to a further feature of the invention, conductors are deposited onto a substrate of a nonconducting fabric, by plating conductive material onto a passivated surface of a cathode against which the fabric is held in tension, the electroplating continuing until the conductive material increases in thickness to form the conductors that embed portions of the fabric and substantially fill interstices that coextend in the fabric with the portions of the fabric that become embedded in the conductors. Advantageously, the fabric, together with the conductors, are easily removed cleanly from the passivated surface of the cathode, and the conductors become secured to the fabric without having to render the fabric conductive prior to depositing the conductors.

Embodiments of the invention will now be described by way of example with reference to the accompanying drawings, according to which:

DESCRIPTION OF THE DRAWINGS

FIG. 1 is a top view of a portion of an array of electrical circuits with optional insulating films;

FIG. 2 is a top view of a portion of an array of electrical circuits in at least one pattern;

FIG. 3 is a section view of a portion of a fabric;

FIG. 4 is a section view similar to FIG. 3, and further illustrating a portion of a cathode;

DETAILED DESCRIPTION

Figure 5:
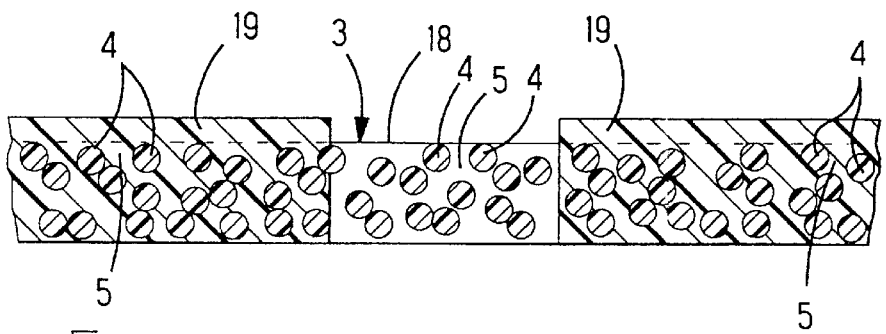
FIG. 5 is a section view similar to FIG. 3, and further illustrating resist material on a fabric.

According to FIGS. 1 and 2 of the drawings, an array of electrical circuits (1) comprises, metal conductors (2) arranged in an array of electrical circuits (1) on an insulating substrate. The substrate comprises a nonconducting fabric (3) of limber filaments (4), together with interstices (5) that coextend in the fabric (3) with the filaments (4). The fabric (3) comprises, a mat, sheet, film, web or cloth in which the filaments (4) are crossed over one another, or bonded together, or woven. The fabric (3) also comprises an insulating limber film or sheet heavily populated with the interstices (5) extending through the sheet from one side to another side, the interstices (5) rendering the sheet into a web of slender filaments (4). A suitable fabric (3) comprises a sheet material 0.005 inch thick fabricated with spun polyester filaments (4), less than 10 percent by volume, that cross over one another to form a mat, followed by calender rolling to reduce a thickness of the fabric (3) to 0.002–0.003 inch thick. The fabric (3) is known as REEMAY spun bonded polyester, style 2004, available from the REEMAY company, old Hickory, Tenn.

Figure 6:
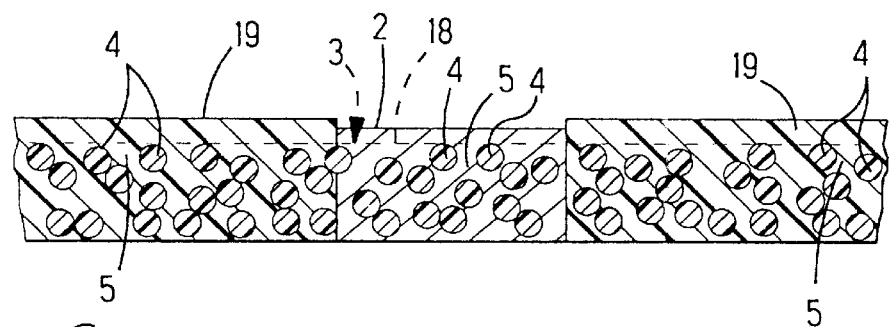
FIG. 6 is a view similar to FIG. 5, and further illustrating a conductor imbedding a fabric.

Conductors (2) are constructed by depositing conductive material upon the fabric (3), FIGS. 4 and 6. Portions of the limber, insulating filaments (4) are embedded in the conductors (2), such that the conductors (2) become secured to the fabric (3). The conductors (2) substantially fill interstices (5) that coextend in the fabric (3) with the embedded portions of the filaments (4), to provide unified bodies of conductive material shaped into an array of impermeable conductors (2).

The conductors (2) are arranged in an array of electrical circuits (1) to form continuous transmission lines (6) of a flat transmission line cable, FIG. 1, or circuit paths (7) in respective patterns on a flexible circuit board, FIG. 2. The conductors (2) on the fabric (3) are exposed on opposite sides of the fabric (3). A flexible cable can be constructed by fabricating the conductors (2) as parallel spaced apart electrical transmission lines (6) on the fabric (3). The exposed conductors (2) are insulated by laminating the fabric (3) and the conductors (2) between upper and lower insulating films (8,9) or sheets of insulating material.

Figure 7:
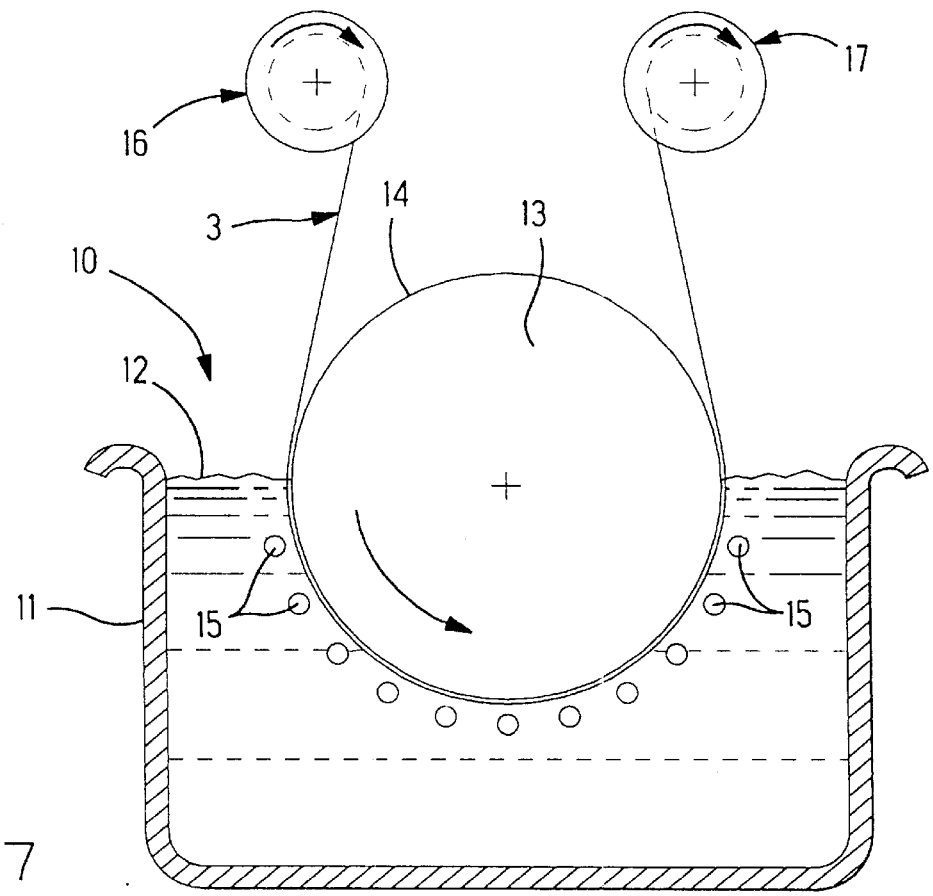
FIG. 7 is a schematic view of a plating apparatus.

With reference to FIG. 7, a plating apparatus (10) comprises, a tank (11) containing a known plating bath (12), a cathode (13) fabricated as a cylindrical surface (14) of a rotatable drum, and a series of anodes (15) immersed in the plating bath (12) and distributed at a distance from the cylindrical surface (14). The apparatus (10) further includes a supply reel (16) on which is reeled a continuous strip of the fabric (3). The fabric (3) is unreeled from the supply reel (16), and extends in the plating bath (12) between the cathode (13) and the anodes (15) that are immersed in the plating bath (12). The strip of fabric (3) is then reeled onto a take up reel (17). According to known plating phenomena, electrical current passes through the plating bath (12), causing conducting material to be plated onto the cathode (13). According to the process being described, the fabric (3) is held in tension against the surface (14) of the cathode (13) while deposited material is plated onto the surface (14). The plating operation is continued until the deposited material increases in thickness and embeds portions of the fabric (3), and substantially fills the interstices (5) that coextend in the fabric (3) with the portions of the fabric (3) that become embedded in the deposited metal. In addition, plating is continued, to increase the thickness of the deposited conducting material to a sufficient mass for supporting a desired electron charge density and current carrying capacity of the conductors (2) on the fabric (3). In addition, with reference to FIGS. 4 and 6, the conductors (2) overlie an exterior (18) of the fabric (3) that faces the cathode (13). Plating the conductive material on the surface (14) of the cathode (13) will cause the conductive material to overlie the exterior (18) of the fabric (3) despite the fabric (3) being held in tension against the surface (14) of the cathode (13). The conductors (2) formed on the exterior (18) of the fabric (3) have a smooth exterior surface upon being removed from the highly polished surface (14) of the cathode (13). The fabric (3), together with the conductive material deposited thereon, is removed from the surface (14) of the cathode (13). The surface (14) comprises a highly polished passivated stainless steel that separates cleanly from the conducting material that has been deposited by the plating process.

It is known to conduct a continuous plating operation with a cylindrical rotating cathode (13) to produce a continuous metal foil. According to an embodiment, herein, a cylindrical cathode (13) is utilized to plate conducting material to form an array of circuits (1) on the fabric (3).

A continuous plating process, FIG. 7, is achieved by plating conducting material (13) upon the surface (14) of the cathode (13) as the cathode (13) is being rotated to roll the cylindrical surface (14) over a continuously moving fabric (3). The conducting material is flexible due to the limber fabric (3) and the limber filaments (4) embedded in the conducting material. The conductors (2) formed by the conducting material are sufficiently flexible to be reeled onto the take up reel (17). An advantage of the invention resides in an array of electrical circuits (1) being secured to a fabric (3) without a need to render the fabric (3) conducting. A further advantage of the invention resides in an array of electrical circuits (1) wherein the circuits (1) are formed by impermeable conductors (2) comprised of unified bodies of conducting material substantially filling interstices (5) that coextend in a fabric (3) with portions of the fabric (3) being embedded in the conductors (2).

The deposited conducting material is shaped into an array of electrical circuits (1), according to the following examples. According to one example, the cylindrical surface (14) of the cathode (13) is arranged in a pattern corresponding to the array of electrical circuits (1). The plating process will deposit the conducting material solely on the pattern, and thereby form electrical conductors (2) in an array of electrical circuits (1) on the fabric (3).

The pattern on the cylindrical surface (14) is obtained by applying a resist material (19) on the cylindrical surface (14), leaving a pattern of an uncovered, conducting surface (20) on the cathode (13), such that the remaining portions of the cylindrical surface (14) which remain uncovered by the resist material (19), or which remain as a conducting surface (20) of the cathode (13), form the desired pattern.

According to another example, with reference to FIGS. 5 and 6, resist material (19) is applied on an exterior (18) of the fabric (3). The resist material (19) fills interstices (5) in the fabric (3). The remainder of the fabric (3) that is uncoated with the resist material (19) forms a pattern corresponding to the array of electrical circuits (1). When the exterior (18) of the fabric (3) is held in tension against the cathode (14), the resist material (19) will contact the cathode (14) and resist deposition of conducting material during the plating process. The conducting material becomes deposited on the pattern. When the fabric (3) together with the conductors (2), is removed from the cathode (14), the resist material (19) on the fabric (3) separates the conductors (2) from one another and remains on the exterior (18) of the fabric (3) beside the conductors (2). A suitable resist material (19) is one that fills interstices (5), withstands the plating operation, and is compatible with the plating bath constituents. A UV curable ink obtained from Argon/USA, Pennsauken, N.J., is suitable, as is an air curable, styrene acrylic copolymer, for example.

In addition to the conductors (2) being secured to the fabric (3), the conductors (2) can chemically bond to the embedded portions of the filaments (4) by applying an adhesion promoting agent, such as a silane material, to the portions of the filaments (4) that are intended to be imbedded in the deposited conducting material. The use of an adhesion promoting agent such as an organic silane is accomplished by coating the fabric (3) in a dilute organic solution of the agent, followed by air drying. A suitable adhesion promoting agent is selected for chemical compatibility with the fabric (3), conductors (2) and plating bath (12) and can comprise, for example, an organic material or substance with an amine or carboxylic acid, molecular structure. A suitable material is obtained from Dow Corning Company, and comprises, 3-glycidoxypropyltrimethoxy silane, that is an epoxy silane, part number Z-6040. The company has available another suitable material, N-(2-Aminoethyl)-3-aminopropyltrimethoxy silane, Z-6020, optimal for copper plating.

In addition, nonbrittle and ductile properties of the plated conductors (2) are enhanced by an organic polymer having an amine or carboxylic acid molecular structure, which allows chemical bonding of the plated conductors (2) thereto. A coating of the polymer is applied to the filaments (4) by dipcoating the fabric (3) in either a solvent solution of the polymer, or a water based dispersion of the polymer in a bath, followed by air drying. Such a polymer coating promotes chemical bonding of the plated conductors (2), especially due to the favorable environment of the plating bath having an acid pH and a moderately elevated temperature of about 70° C. The polymer can be blended with the silane material previously described before being applied to the filaments (4).

A suitable material for polymer coating the fabric (3) in a water based dispersion, is Hycar 1561 acrylonitrile copolymer obtained from B.F. Goodrich, Akron, Ohio. Another suitable material is, Araldite IECN 1400 Epoxyester polymer obtained from CIBA-GEIGY Corporation location 281 Fields Lane, Brewster, N.Y., 10509.

We claim:

1. A method of manufacturing an array of electrical conductors comprising the steps of:

holding a fabric in tension against a surface of a passivated metal cathode, plating conductive material onto the cathode until said conductive material imbeds portions of the fabric, and until said conductive material forms unified bodies of said conductive material that substantially fill interstices that coextend in the fabric with the portions of the fabric that become embedded in said conductive material, removing the fabric together with said unified bodies of said conductive material from the surface of the cathode, to provide an array of electrical circuits substantially filling said interstices in the fabric, and coating the fabric in a water based dispersion of an acrylonitrile copolymer, prior to the step of plating conductive material onto the cathode.

* * * * *